Figure 1:
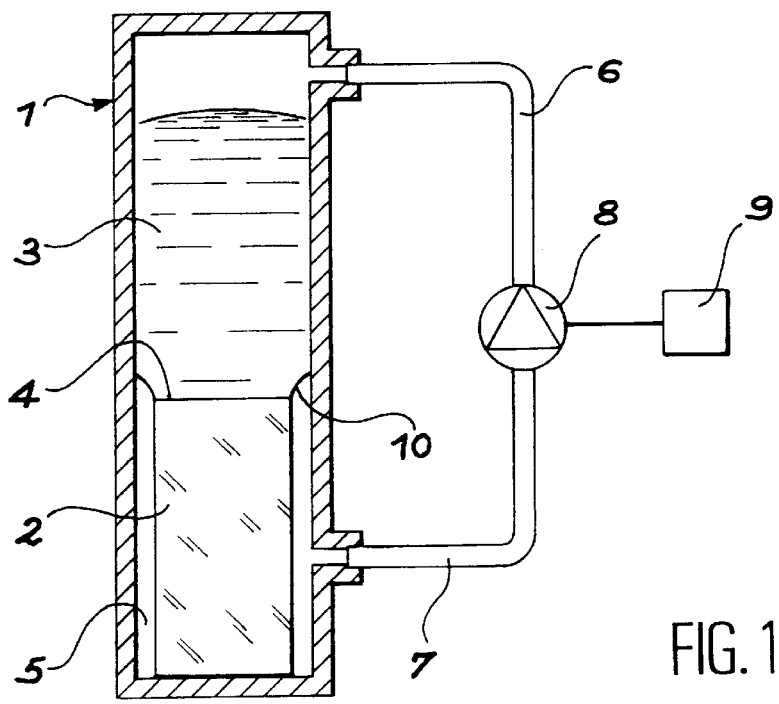

United States Patent [19]
Duffar et al.

[11] Patent Number: 5,932,005
[45] Date of Patent: Aug. 3, 1999

[54] CRYSTALLOGENESIS DEVICE AND PROCESS

[75] Inventors: Thierry Duffar, Grenoble; Jacques Abadie, Sassenage; Pierre Dusserre, St. Egreve, all of France

[73] Assignees: Commissariat A L'Energie Atomique, Paris, France; Centre National D'Etudes Spatiales, Paris Cedex, France

[21] Appl. No.: 08/989,226

[22] Filed: Dec. 11, 1997

[30] Foreign Application Priority Data

Dec. 12, 1996 [FR] France .................................. 96 15280

[51] Int. Cl.$^6$ ............................................. C30B 7/10
[52] U.S. Cl. ............................. 117/83; 117/81; 117/206; 117/219; 117/223
[58] Field of Search ................................. 117/71, 73, 77, 117/81, 83, 219, 204, 205, 206, 223

[56] References Cited

U.S. PATENT DOCUMENTS

| | | | |
|---|---|---|---|
| 4,242,307 | 12/1980 | Fally | 117/204 |
| 4,668,493 | 5/1987 | Levin | 117/206 |
| 5,698,029 | 12/1997 | Fujikawa et al. | 117/204 |
| 5,772,761 | 6/1998 | Petroz | 117/204 |

FOREIGN PATENT DOCUMENTS

| | | |
|---|---|---|
| 0 070 760 | 1/1983 | European Pat. Off. . |
| 0 565 415 | 3/1995 | European Pat. Off. . |
| 0 656 415 | 6/1995 | European Pat. Off. . |
| 2 345 253 | 10/1977 | France . |

*Primary Examiner*—Felisa Hiteshew
*Attorney, Agent, or Firm*—Michael N. Meller

[57] ABSTRACT

The material of the crystal (2) formed by solidification is deposited in a crucible (1), whose wall is perforated by two ducts for the injection of pressure at different heights (6, 7). A differential pressure is created between the two ducts, the pressure of the lower duct (7) being higher by a value roughly equal to the hydrostatic pressure of the remaining liquid (3), so that a clearance (5) is spontaneously formed between the crystal (2) and the crucible (1) and problems caused by differential thermal contractions on cooling are avoided.

4 Claims, 2 Drawing Sheets

CRYSTALLOGENESIS DEVICE AND PROCESS

DESCRIPTION

The invention relates to a crystallogenesis device in a crucible by solidification of a liquid in the presence of a nucleus of the crystal.

Thus, the crucible is filled with liquid after depositing the nucleus therein, followed by the progressive removal or displacement of the heating means maintaining the liquid in this state. The liquid firstly solidifies close to the nucleus, then the liquid-solid interface is displaced towards the top of the crucible until solidification is complete. As the newly formed solid reproduces the crystallographic structure of the adjacent solid formed beforehand, the nucleus gradually imposes its crystallographic structure on the entire content of the crucible.

However, such processes suffer from problems of differential thermal expansions of the crucible and its content. If the crucible contracts more than the crystal during cooling, the latter could be damaged or even fractured and it would be impossible to extract it from the crucible, which would have to be destroyed. In the opposite case, the crystal would also not necessarily remain intact, because it will generally adhere to the crucible after solidification, so that tensile stresses remain.

The idea has already been put forward of using crucibles of a sufficiently elastic material to ensure that such problems are of reduced significance. Another idea consists of intercalating a soft or compressible substance between the crucible and its content, e.g. a fabric or liquid, but it is difficult to find a suitable product, because it must be chemically compatible with the content of the crucible, i.e. does not react therewith, it must not be destroyed by the temperatures reached and must not disturb the solidification process.

It has also been proposed to insulate the crucible from its content by intercalating a gaseous layer between them. In the known designs, this method involves the crucible wall being porous and for the crucible to be hollow, so that a gas is blown into the chamber enclosed by the crucible and by the porous wall so as to form a gaseous layer, which pushes back the liquid towards the centre of the crucible. This method is effective and relatively easy to perform, but still suffers from the same disadvantage that the crucible shape must be complicated, particularly as a result of the existence of the porous wall.

The invention relates to a crystallogenesis device, where a gaseous layer is again used for separating the crystal from the crucible wall, but which differs from the known devices, because the crucible wall is not porous and no gaseous layer is created at the level of the liquid.

It specifically relates to a device comprising a closed crucible, in which a crystal is formed by the solidification of a liquid, means for creating a mobile thermal field along the crucible, an upper duct and a lower duct issuing at different heights into the crucible, and means for supplying gas to the ducts and crucible, at a higher pressure in the lower duct than in the upper duct and with a variable pressure difference between the upper duct and the lower duct.

It also relates to a crystallogenesis process using said device, which is characterized in that the upper duct issues above the liquid and the lower duct issues in front of the solidified crystal, and the pressure in the lower duct exceeds the pressure in the upper duct substantially by the height pressure of the liquid.

The invention is described in greater detail hereinafter relative to non-limitative embodiments and the attached drawings, wherein show:

FIG. 1 A diagrammatic illustration of the invention.

Figure 2:
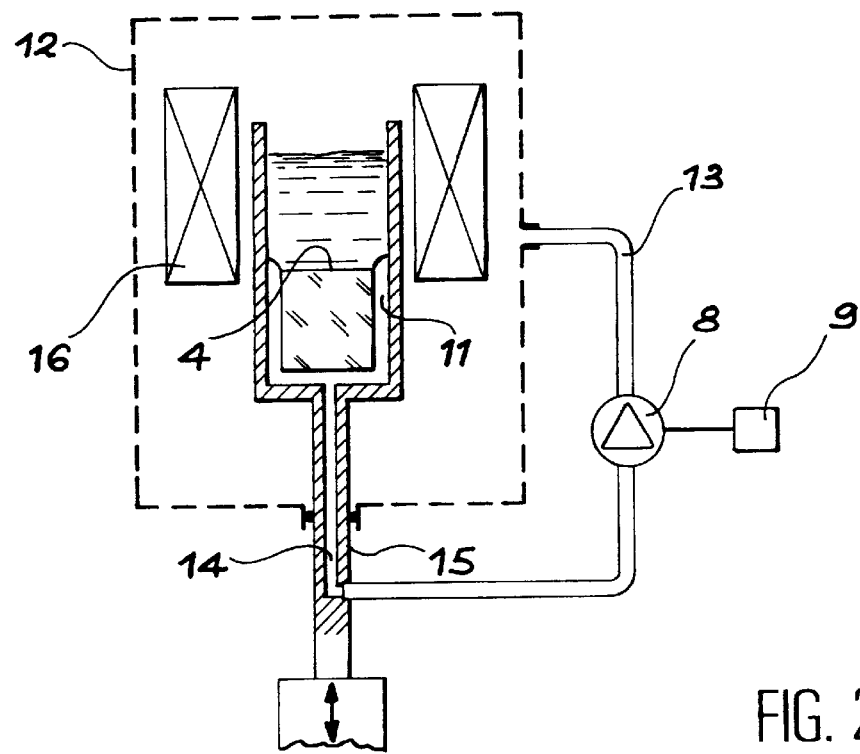

FIG. 2 More completely a device for performing the invention.

Figure 3:
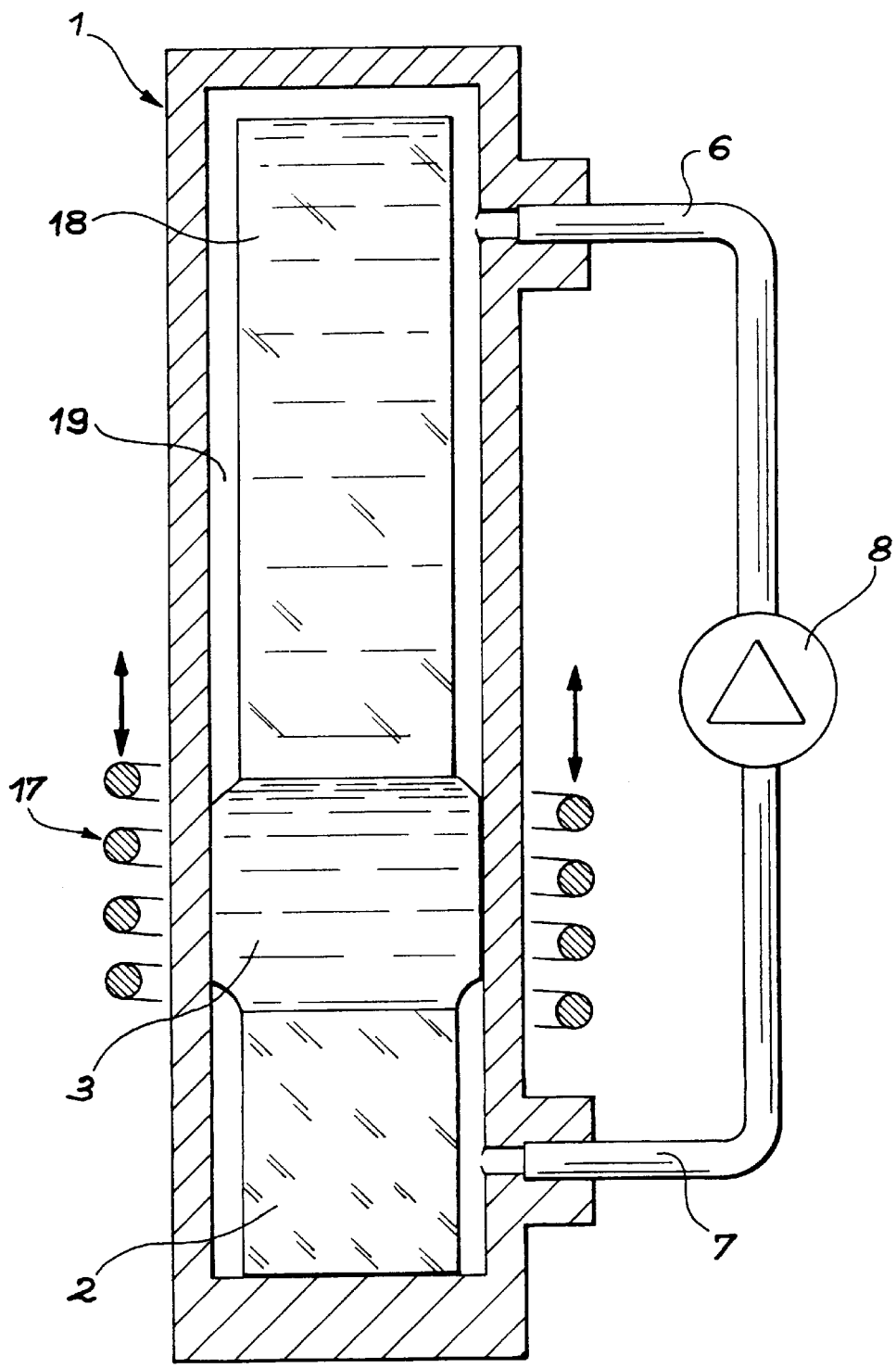

FIG. 3 Another embodiment of the invention.

FIG. 1 shows a closed, cylindrical crucible 1 containing a crystal 2 in its lower part and a liquid 3 to be solidified above an interface 4 with the crystal 2. The liquid 3 wets the wall of the crucible 1, but the crystal 2 is separated from the wall of the crucible 1 by a clearance 5. An upper duct 6 issues into the crucible 1 above the free surface of the liquid 3 and a lower duct 7 also issues into the crucible 1 at a lower level thereof and in front of the crystal 2. The ducts 6 and 7 join in front of a system 8 creating a differential pressure and which can be constituted by a valve, a pump or a compressor controlled by a regulator 9 in accordance with the principles given hereinafter. The interface 4 is connected to the wall of the crucible 1 by a meniscus 10 above the clearance 5.

FIG. 2 shows that in the sense of the invention a closed crucible can represent a crucible 11 open in its upper part, but enclosed in a tight enclosure 12, in which is maintained an atmosphere with a desired composition. The upper duct 13 can then issue into the enclosure 12. The lower duct 14 can be terminated by a vertical rod 15 coaxial to the enclosure 12 and leading to the bottom of the crucible 11, which makes it possible to apply the idea of the invention to processes where the deposited crystal germ is of very limited height.

An oven 16 or some other heating device is placed in the enclosure 12 around the crucible 11. The support rod 15 of the crucible 11, sliding across the enclosure 12, makes it possible to vertically move the crucible 11 from the outside and said crucible 11 is progressively lowered during the solidification process, the interface 4 remaining level with the bottom end of the oven 16.

The pressure injected by the system 8 into the lower duct 7 or 14 is higher than that of the upper duct 6 or 13 by a value substantially equal to the hydrostatic pressure of the liquid 3, i.e. the pressure produced by the height of the liquid column 3, and the precise value to be applied can be determined by experience or by comparative tests as a function of the wetting properties of the phases present (gas, liquid 3, crystal 2 and crucible 1). This pressure difference must decrease as the crystal 2 solidifies and the height of the liquid 3 decreases.

The essential teaching of the invention is that the clearance 5 appears spontaneously under these conditions when the crystal 2 solidifies. It is not present level with the liquid 3, which is not considered important because the crucible 1 and liquid 3 do not react with one another. A single orifice is necessary for each of the ducts, so that there is no need for the porous wall normally provided in gaseous layer support procedures.

FIG. 3 shows another situation with the crucible of FIG. 1. Use is made here of a slightly different solidification process, where the material for forming the crystal is deposited in the solid state in the crucible 1 before being melted and is then resolidified assuming the crystallographic structure of the nucleus. The heating element 17 and which can be of any known type, e.g. a field coil, consequently has a height considerably less than that in the case of FIG. 2 and is upwardly displaced along the crucible 1. The liquid 3 remains level with the heating means 17 and the top of the crucible 1 is occupied by the solid material 18 in the initial, uncrystallized state. Obviously care has been taken to maintain an initial clearance 19 between the initial material 18 and the crucible 1, so that the original pressure of the upper duct 6 can be exerted up to the level of the upper surface of the liquid 3.

We claim:

1. A crystallogenesis process using the crystallogenesis device comprising a closed crucible (1, 11, 12), in which a crystal (2) is formed by solidification of a liquid (3), means (16, 17) for creating a mobile thermal field along the crucible, an upper duct (6, 13) and a lower duct (7, 14) issuing at different heights into the crucible (1, 11) and means (8) for supplying gas to the ducts and crucible at a higher pressure to the lower duct than to the upper duct and with a variable pressure difference between the upper duct and the lower duct, characterized in that the upper duct issues above the liquid and the lower duct issues in front of the solidified crystal, and the pressure in the lower duct exceeds the pressure in the upper duct substantially by the height pressure of the liquid.

2. A crystallogenesis device comprising a closed crucible (1, 11, 12), in which a crystal (2) is formed by the solidification of a liquid (3) and means (16, 17) for creating a mobile thermal field along the crucible, characterized in that it has an upper duct (6, 13) and a lower duct (7, 14) issuing at different heights into the crucible (1, 11), and means (8) for supplying gas to the ducts and crucible at a higher pressure in the lower duct than in the upper duct and with a variable pressure difference between the upper duct and lower duct.

3. A crystallogenesis device according to claim 2, characterized in that the crucible is constituted by a crucible (11) which is open at the top and a tight enclosure (12) containing the crucible (11) and the thermal field creating means.

4. A crystallogenesis device according to claim 2, characterized in that the upper duct (13) issues into the enclosure (12) and the lower duct (14) issues into the crucible (11) and terminates in a support rod (15) for the crucible (11) sliding through the enclosure (12).

* * * * *